United States Patent [19]
Lau et al.

[11] Patent Number: 5,990,536
[45] Date of Patent: Nov. 23, 1999

[54] INTEGRATED CIRCUIT ARRANGEMENT HAVING AT LEAST TWO MUTUALLY INSULATED COMPONENTS, AND METHOD FOR ITS PRODUCTION

[75] Inventors: Frank Lau, Bruckmühl; Wolfgang Krautschneider, Hohenthann; Manfred Engelhardt, Feldkirchen-Westerham, all of Germany

[73] Assignee: Siemens Aktiengesellschaft, Munich, Germany

[21] Appl. No.: 08/981,674

[22] PCT Filed: Jun. 24, 1996

[86] PCT No.: PCT/DE96/01109

§ 371 Date: Jan. 6, 1998

§ 102(e) Date: Jan. 6, 1998

[87] PCT Pub. No.: WO97/03463

PCT Pub. Date: Jan. 30, 1997

[30] Foreign Application Priority Data

Jul. 10, 1995 [DE] Germany .......................... 195 25 072

[51] Int. Cl.[6] ............... H01L 29/00; H01L 29/76
[52] U.S. Cl. .............. 257/510; 257/513; 257/515; 257/396; 257/397
[58] Field of Search .................. 257/301, 302, 257/303, 304, 305, 396, 397, 510, 513, 514, 515; 438/424, 427, 428, 429, 430, 444, 445, 446, 244, 248, 386, 391, 296, 227 FOR

[56] References Cited

U.S. PATENT DOCUMENTS

| | | |
|---|---|---|
| 4,763,179 | 8/1988 | Tsubouchi et al. . |
| 4,835,584 | 5/1989 | Lancaster . |
| 4,894,695 | 1/1990 | Ishii et al. ........................ 257/301 |
| 4,977,436 | 12/1990 | Tsuchiya et al. . |
| 5,122,848 | 6/1992 | Lee et al. . |
| 5,176,789 | 1/1993 | Yamazaki et al. .................. 438/700 |
| 5,229,318 | 7/1993 | Strboni et al. . |
| 5,336,912 | 8/1994 | Ohtsuki . |
| 5,512,517 | 4/1996 | Bryant . |

FOREIGN PATENT DOCUMENTS

| | | | |
|---|---|---|---|
| 000540262 | 5/1993 | European Pat. Off. .......... 438/227 |
| 38 09 218 A1 | 9/1988 | Germany . |
| 358134445 | 8/1983 | Japan ................................. 438/227 |
| 358169934 | 10/1983 | Japan ................................. 438/227 |
| 404151850 | 5/1992 | Japan ................................. 438/227 |

OTHER PUBLICATIONS

Patent Abstracts of Japan, E–649, Aug. 25, 1988, vol. 12 No. 314, Hitachi, Ltd., and Katsutada Horiuchi, Semiconductor Device, JP 63–78573 dated Apr. 8, 1988.

Journal of the Electrochemical Society, Solid–State Science and Technology, Aug. 1987, M. Engelhardt et al, A New $CbrF_3$ Process for Etching Tapered Trenches in Silicon, pp. 1985–1988.

Academic Press, Inc., (1984) VLSI Electronics Microstructure Science, vol. 8, Plasma Processing for VLSI, edited by Norman G. Einspruch et al, pp. 124–127.

Primary Examiner—Tom Thomas
Assistant Examiner—Ori Nadav
Attorney, Agent, or Firm—Hill & Simpson

[57] ABSTRACT

An integrated circuit arrangement having at least two components has in a substrate, an insulation structure (4', 5) between the components which covers at least one side of a trench (3) and is thicker at the bottom of the trench than at the neck of the trench. The components are in this case arranged in different planes on the substrate surface and on the trench bottom. The insulation structure effects vertical insulation between the components.

7 Claims, 5 Drawing Sheets

INTEGRATED CIRCUIT ARRANGEMENT HAVING AT LEAST TWO MUTUALLY INSULATED COMPONENTS, AND METHOD FOR ITS PRODUCTION

BACKGROUND OF THE INVENTION

Trench insulation is used in semiconductor technology, especially MOS technology, in order to isolate components in a substrate electrically from one another given a small width of an insulation region. A longitudinal trench which is completely filled with $SiO_2$ is mainly used as trench insulation. The depth of the trench generally corresponds approximately to the smallest structure dimension in the respective technology.

Leakage currents in the bulk are prevented by the trench insulation. If insulating layers and conductive layers are arranged on the surface of the trench, then leakage currents may occur at the surface on account of parasitic MOS components. These leakage currents must also be prevented by the trench insulation.

In order to improve the insulation behaviour of the trench insulation, doped regions which prevent the formation of conductive channels are employed in the region of the trench insulation. These doped regions are generally produced by implantation. However, this implantation influences the parameters of the components which are insulated from one another.

It has furthermore been proposed to enlarge the cross-section of the trench in the region of the bottom section of the trench. The components to be insulated are arranged on the surface of the substrate (see German Reference DE 38 09 218 A1).

SUMMARY OF THE INVENTION

The invention is based on the problem, therefore, of specifying an integrated circuit arrangement in which at least two components are insulated from one another in a space-saving manner and any impairment of the properties of the components due to implantation which is necessary for the insulation is avoided. It is furthermore intended to specify a method for the production of such an integrated circuit arrangement.

The integrated circuit arrangement according to the invention is integrated in a semiconductor substrate. The semiconductor substrate preferably comprises monocrystalline silicon or the monocrystalline silicon layer of an SOI substrate.

Arranged in the semiconductor substrate is a trench, which reaches from a main area of the semiconductor substrate down into the semiconductor substrate. At least one side of the trench is provided with an insulation structure which insulates a first component from a second component. That side of the trench which is provided with the insulation structure has a bulge, with the result that the width of the trench is greater in the region of the trench bottom than in the region of the The first component is arranged on the main area and the second component is arranged on the trench bottom. The insulation structure covers the side arranged between the two components. The increased thickness of the insulation structure in the region of the bulge ensures that a parasitic MOS component which may possibly be produced along the side has such a high threshold voltage that at the operating voltages no leakage currents occur at the surface of the side.

The insulation structure reaches from the main area right down to the trench bottom. The thickness of the insulation structure, that is to say the extent of the insulation structure perpendicular to the side, is in this case greater in the region of the bulge than at the main area. The lateral extent of the insulation structure according to the invention is greater in the substrate than at the main area of the substrate. As a result, the insulation effect of the insulation structure is improved compared with the value which would be obtained with an insulation structure which has the constant lateral extent at the main area over the entire depth.

Since the insulation structure is arranged on the side of the trench, the first component and the second component can be arranged directly next to one another when projected onto the main area. Since the first component is arranged on the main area and the second component is arranged on the trench bottom and the insulation structure is arranged between them on the trench side, they are insulated from one another. The blocking behaviour of the insulation structure can in this case be set, in particular, via its thickness in the region of the bulge.

The invention can advantageously be used to construct a memory cell arrangement. To this end, the integrated circuit arrangement comprises a plurality of identical strip-like trenches which run essentially parallel. The sides of the trenches each have bulges in the region of the trench bottom and are each provided with an insulation structure. A plurality of MOS transistors of the memory cell arrangement which are interconnected in series are in each case arranged on the main area between adjacent trenches and on the trench bottoms. By using self-aligning production methods, it is possible to produce such a memory cell arrangement with an area requirement for each memory cell of $2F^2$, where F is the minimum structure size in the respective technology.

In order to produce the circuit structure according to the invention, a trench which has a greater width in the region of the trench bottom than at the main area is produced in the main area of the substrate. The bulges in the side of the trench can be produced in various ways. On the one hand, the trench is produced by plasma etching, the etching being carried out in a parameter range such that the so-called "barrelling effect" (also called "bowing") occurs. This is understood to mean a bulge in the lower region of the trench profiles which occurs during plasma etching of silicon in the event of an increase in pressure above that pressure at which anisotropic etching is realized. The barrelling effect (or bowing) is disclosed, for example, in M. Engelhardt, S. Schwarzl, J. Electrochem. Soc., Vol. 134, page 1985 (1987) and VLSI Electronics Microstructure Science, Volume 8, Plasma Processing for VLSI N. G. Einspruch and D. M. Brown, Chapter 5, Academic Press Inc., Orlando, 1984, page 124 ff. This effect (also called "bowing") can also be observed when the RF power is reduced below that RF power at which anisotropic etching is realised. Alternative processes for producing barrelling/bowing during silicon etching are HBr, $0_2$, $NF_3$, with the RF power <500 W, or $CBrF_3$ with the RF power <50 W.

On the other hand, the trench profile can be realised by a combination of anisotropic and isotropic etching processes. Preferably, an anisotropic plasma etching process is carried out in a first etching step and an isotropic plasma etching process or isotropic wet etching is carried out in a second etching step. Anisotropic plasma etching processes can be conducted in such a way that etching products, which are referred to as side wall passivation layers, are deposited on the side walls of the resulting trench. In the case of etching a trench in silicon, these side wall passivation layers comprise oxide-like compounds. The thickness of the side wall passivation layer decreases towards the trench bottom. As a result, in the isotropic second etching step the upper region of the side of the trench is protected against etchant attack and the bulge is produced only in the region of the trench bottom.

In order to form the insulation structure, the trench is preferably filled with a first insulating layer. The first insulting layer is etched back by anisotropic etching selectively with respect to the substrate material. In the process, an etching residue of insulating material remains in the bulges of the trench. It essentially fills the bulge. Insulating spacers are produced on the sides of the trench by deposition and anisotropic etching back of a second insulating layer with essentially conformal edge covering, which insulating spacers, together with the etching residue arranged in the bulge, in each case form the insulation structure. In this way, the insulation structure is formed in a manner self-aligned with the trench, that is to say without the use of a mask to be aligned with the trench. The trench can be formed with a minimum width of F (F: minimum structure width in the respective technology). The lateral extent of the insulation structure is determined by the depth of the bulge perpendicular to the side of the trench and by the layer thickness of the second insulating layer from which the spacers are formed. The bulge is preferably made with a radius <F/4. The width of the spacer is preferably to be made likewise <F/4. The insulation voltage between a component on the main area and a component on the trench bottom is thus increased approximately by a factor of 2 in comparison with the value which would be produced if only the spacer were used as insulation structure.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 5 to FIG. 10 show steps in the production of a memory cell arrangement.

DESCRIPTION OF THE PREFERRED EMBODIMENTS

A substrate 1 made, for example, of monocrystalline silicon has a main area 2. A trench mask made, for example, of TEOS (not illustrated) is applied to the main area 2. Using the trench mask as an etching mask, a trench 3 is etched into the substrate 1 (see FIG. 1). The trench 3 has an extent of, for example, F perpendicular to the main area 2. The trench 3 has bulges 3' in the region of the trench bottom. As a result, the width of the trench 3 is greater in the region of the trench bottom that at the main area 2. At the main area 2, the trench 3 has a width of, for example, F. In contrast, the maximum width in the region of the bulges 3' is F+2 F/4. F is the smallest structure size that can be produced with the respective technology. F is, for example, 0.4 $\mu$m.

Figure 1:
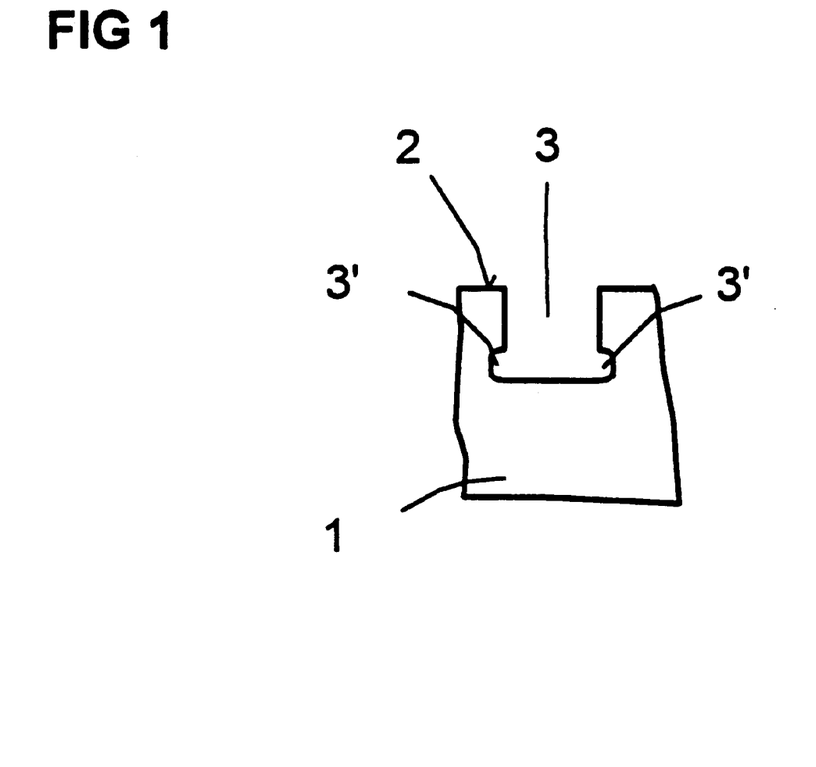
FIG. 1 shows a substrate with a trench whose sides have bulges in the region of the trench bottom.

The trench 3 with the bulges 3' is produced, for example, by plasma etching with $CBrF_3$ in the pressure range >15 mTorr or with HBr, $O_2$, $NF_3$ in the pressure range >100 mTorr. At this pressure, the bulges 3' are produced by the barrelling effect.

Alternatively, the trench 3 is produced by the combination of an anisotropic plasma etching process with HBr, $O_2$, $NF_3$ in the pressure range >100 mTorr or with $CBrF_3$ in the pressure range >15 mTorr and an isotropic plasma etching process with $NF_3$ in the pressure range of >500 mTorr. The bulges 3' are produced during the isotropic plasma etching process. The side wall passivation layers which have been deposited on the sides of the trench 3 during the anisotropic plasma etching process protect the upper region of the trench 3 during the isotropic plasma etching.

A further option for forming the trench 3 with the bulges 3' is constituted by the combination of an anisotropic plasma etching process with, for example, HBr, $O_2$, $NF_3$ in the pressure range >100 mTorr or with $CBrF_3$ in the pressure range greater than 15 mTorr and isotropic wet-chemical etching, for example with choline in aqueous solution or KOH. In this case, too, the upper region of the trench sides is protected against attack during the isotropic etching by means of side wall passivation layers. The isotropic etching results in the formation of the bulges 3'.

A first insulating layer made, for example, of $SiO_2$ is subsequently applied to the main area 2. The first insulating layer 4 completely fills the trench 3. The first insulating layer 4 is deposited (see FIG. 2), for example, using a CVD method to a thickness of at least F, that is to say 0.4 μm.

Figure 2:
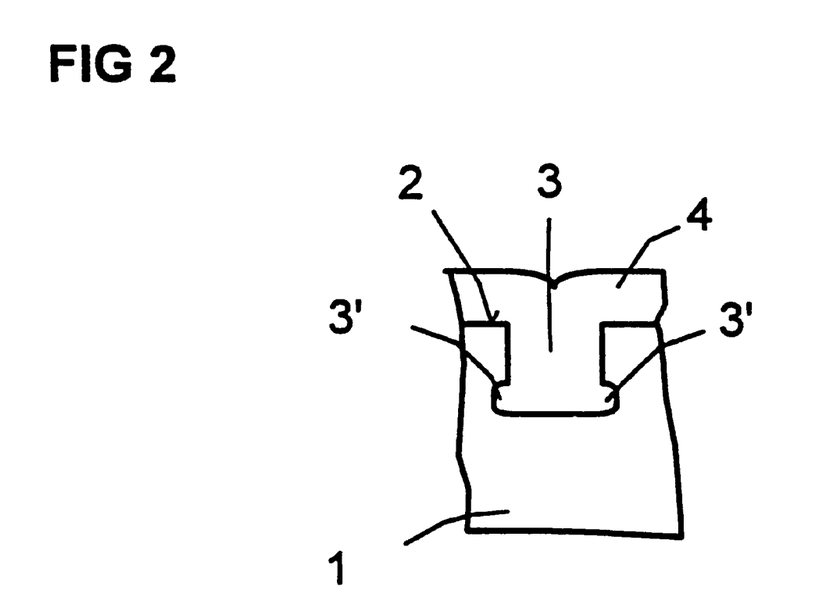
FIG. 2 shows the substrate after the trench has been filled with a first insulating layer.

Planarization takes place after this, during which the main area 2 of the substrate 1 is exposed. The planarization takes place, for example, by means of plasma-assisted etching back of the first insulating layer or by means of chemical mechanical polishing (CMP).

Figure 3:
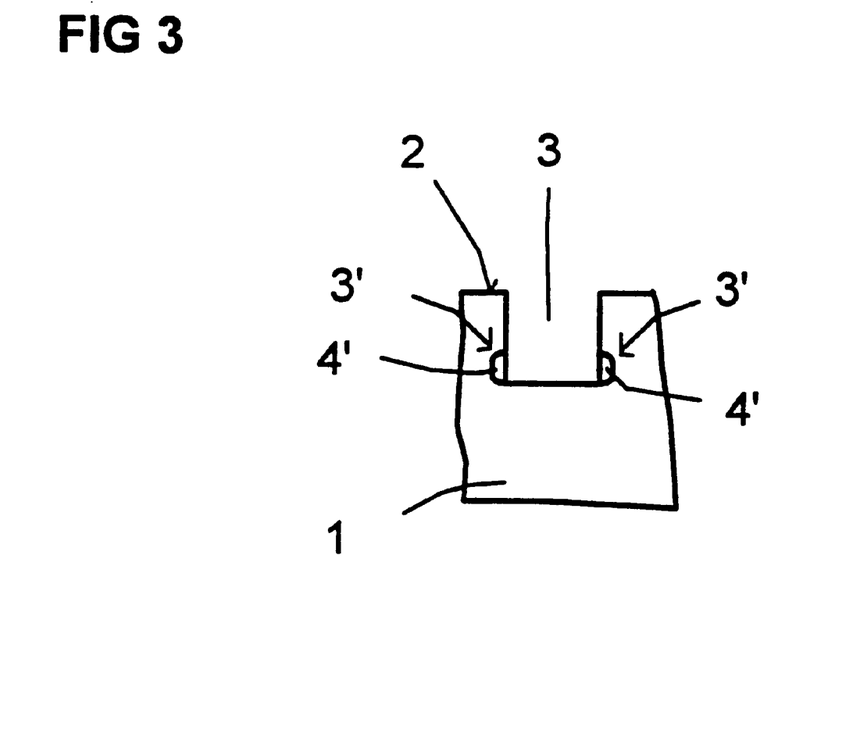
FIG. 3 shows the substrate after the first insulating layer has been etched back, etching residues remaining in the bulges.

The remaining first insulating layer 4 is etched back in an anisotropic etching process selectively with respect to silicon. In the process, the silicon surface is exposed on the trench bottom. Etching residues 4' of $SiO_2$ remain in the bulges 3'. The etching back is carried out, for example, with $CHF_3$, $CF_4$, Ar in the pressure range of 50 to 500 mTorr (see FIG. 3).

A second insulating layer made, for example, of $SiO_2$ is deposited with essentially conformal edge covering. The second insulating layer is deposited, for example, using a TEOS-CVD method to a thickness of, for example, 40 nm. Insulating spacers 5 are formed on the sides of the trench 3 from the second insulating layer by anisotropic etching, for example, with $CHF_3$, $CF_4$, Ar in the pressure range of 50 to 500 mTorr. The spacers 5 have a width of approximately 40 nm. The trench bottom is exposed between the spacers 5 on opposite sides of the trench 3 (see FIG. 4).

Figure 4:
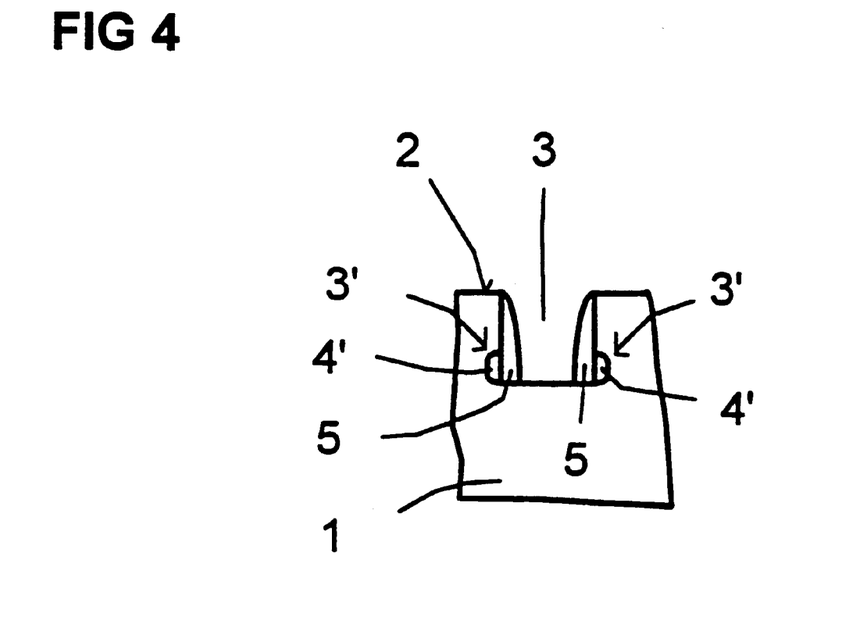
FIG. 4 shows the substrate following the formation of insulating spacers.
Figure 5:
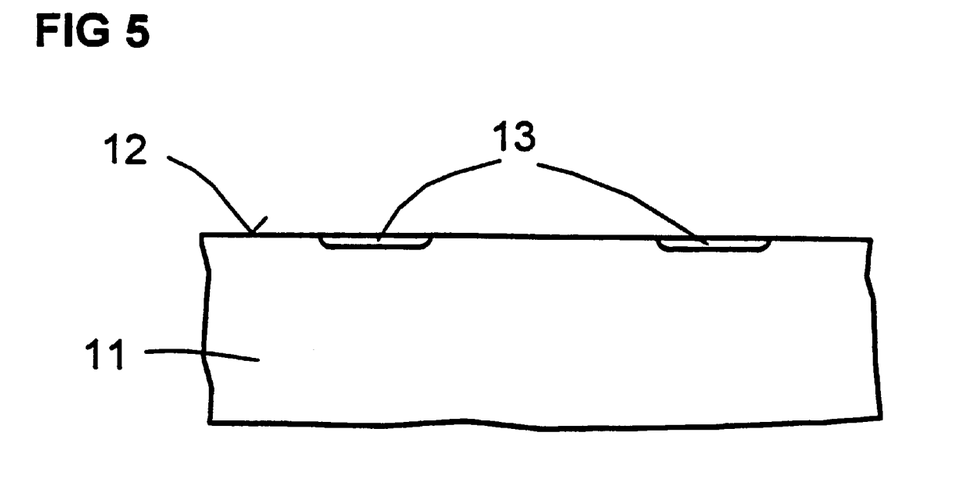
FIG. 5 shows a substrate following a first channel implantation.

A first component is produced on the main area 2 and a second component is produced on the trench bottom. The components are MOS transistors, for example. The first component is insulated from the second component by the insulation structure which is arranged on the side of the trench 3 lying in between them and is composed of the respective insulating spacer 5 and the etching residue 4'. If a conductive layer is arranged on the surface of the spacer 5, then a parasitic MOS element is produced between the two components, which element has a threshold voltage of more than 15 volts owing to the thickness of the insulation structure in the region of the bulges 3', that is to say far above the normal operating voltages for MOS transistors.

The production of a read-only memory cell arrangement having improved vertical insulation is explained below with reference to FIGS. 5 to 10. The memory cells of the read-only memory cell arrangement take the form, for example, of MOS transistors, which have different threshold voltages depending on the information stored in the respective memory cell.

In order to produce the read-only memory cell arrangement in a substrate 11 made, for example, of monocrystalline silicon, an insulation structure which defines (not illustrated) the region for the read-only memory cell arrangement is first produced on a main area 12 of the substrate 11. The substrate 11 is, for example, p-doped with a dopant concentration of, for example, $10^{16}$ $cm^{-3}$.

Regions for the depletion channels of MOS transistors are then defined with the aid of a photolithographic method. The depletion channels 13 are formed (see FIG. 5) with the aid of a first channel implantation with arsenic at an energy of 50 keV and a dose of $4 \times 10^{12}$ $cm^{-2}$. When using 0.4 μm technology, the extent of the depletion channels 13 parallel to the main area 12 is, for example, 0.6 μm×0.6 μm.

After an $SiO_2$ layer has been deposited to a thickness of, for example, 200 nm with the aid of a TEOS method, a trench mask is formed (not illustrated) by structuring the $SiO_2$ layer with the aid of photolithographic methods. Using the trench mask as an etching mask, longitudinal trenches 14 are etched by anisotropic etching with $Cl_2$, for example. The longitudinal trenches 14 have a depth of, for example, 0.6 μm. The width of the depletion channels 13 is set during the etching of the longitudinal trenches 14. The alignment of the trench mask relative to the depletion channels 13 is therefore not critical.

In the case of 0.4 μm technology, the width of the longitudinal trenches 14 is 0.4 μm, and the spacing between adjacent longitudinal trenches 14 is likewise 0.4 μm. The length of the longitudinal trenches 14 depends on the size of the memory cell arrangement and is 130 μm, for example.

The sides of the longitudinal trenches 14 have bulges 14' in the region of the bottom of the longitudinal trenches 14. These bulges are formed by isotropic etching, for example with choline in aqueous solution. The bulges 14' have a maximum depth of, for example, 100 nm perpendicular to the sides of the longitudinal trenches 14.

The longitudinal trenches 14 with the bulges 14' are filled by CVD deposition of a first insulating layer. The main area 2 is subsequently exposed again by planarization by mean of selective anisotropic plasma etching or chemical mechanical polishing (CMP). The first insulating layer is etched back by anisotropic etching selectively with respect to silicon using, for example, $CHF_3$, $CF_4$, Ar. In the process, the bottom of the longitudinal trenches 14 is exposed. Etching residues 15 which are made of $SiO_2$ and fill the bulges 14' remain in the region of the bulges 14'.

Next, regions for the depletion channels for MOS transistors which are subsequently produced at the bottom of the longitudinal trenches 14 are defined with the aid of a photolithographic method. The depletion channels 16 are produced (see FIG. 6) at the bottom of the longitudinal trenches 14 by means of a second channel implantation with, for example, arsenic at an energy of, for example, 50 keV and a dose of, for example, $4 \times 10^{12}$ $cm^{-2}$. The regions between adjacent longitudinal trenches 6 are masked here by the trench mask. The alignment during the definition of the depletion channels 16 is therefore not critical. The second channel implantation is self-aligned with regard to the side walls of the longitudinal trenches 14.

Figure 6:
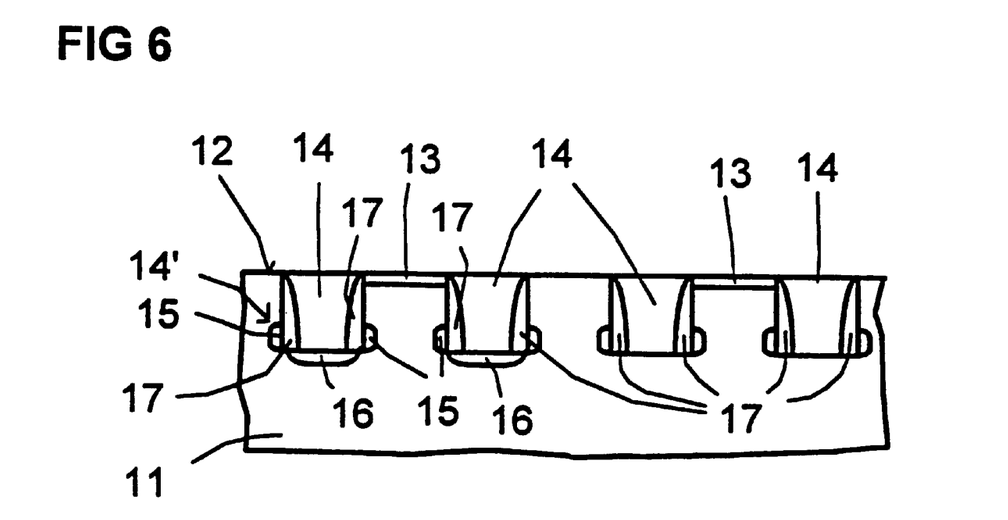
FIG. 6 shows the substrate following trench etching, a second channel implantation and the formation of insulation structures.

The trench mask is subsequently removed wet—chemically, for example with $NH_4F/HF$. Spacers 17 made of $SiO_2$ are formed on the side walls of the longitudinal trenches 14 by deposition of a further $Sio_2$ layer using a TEOS method and subsequent anisotropic etching. The anisotropic etching is carried out, for example, with $CHF_3$, $CF_4$, Ar. The spacers 17 and the etching residues 15 together form the insulation structure which insulates adjacent MOS transistors from one another.

After a sacrificial oxide has been grown on and etched away, a gate oxide layer 18 is grown on to a thickness of, for example, 10 nm. The gate oxide layer 18 is arranged on the bottom of the longitudinal trenches 14 and between the longitudinal trenches 14 on the main area 12 (see FIG. 7, FIG. 8, which illustrates that section through FIG. 7 which is designated by VIII—VIII, and FIG. 9, which illustrates that section through FIG. 7 which is designated by IX—IX.

Figure 7:
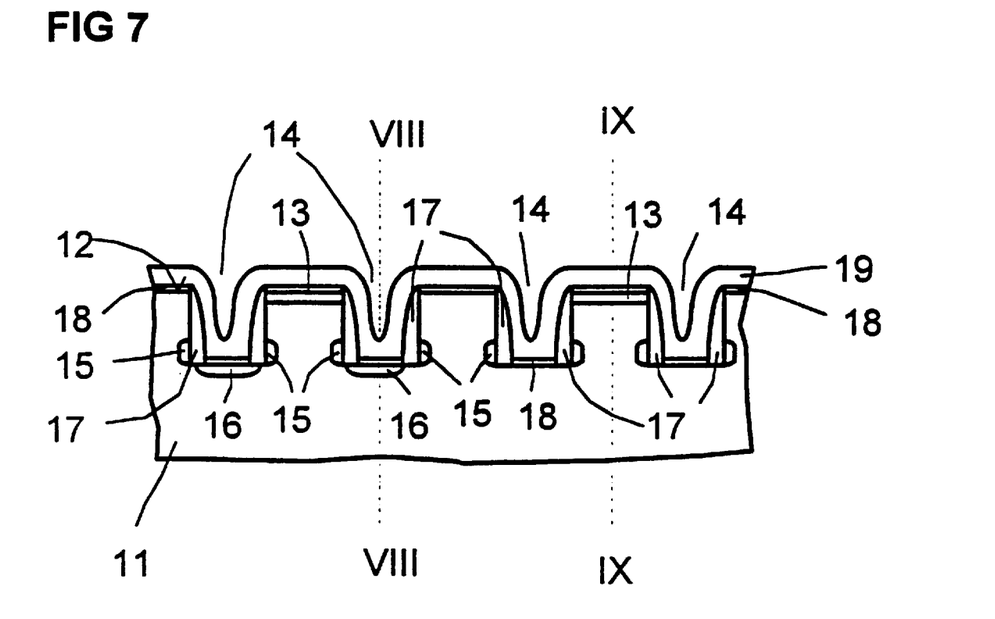
FIG. 7 shows the substrate following the formation of word lines.
Figure 8:
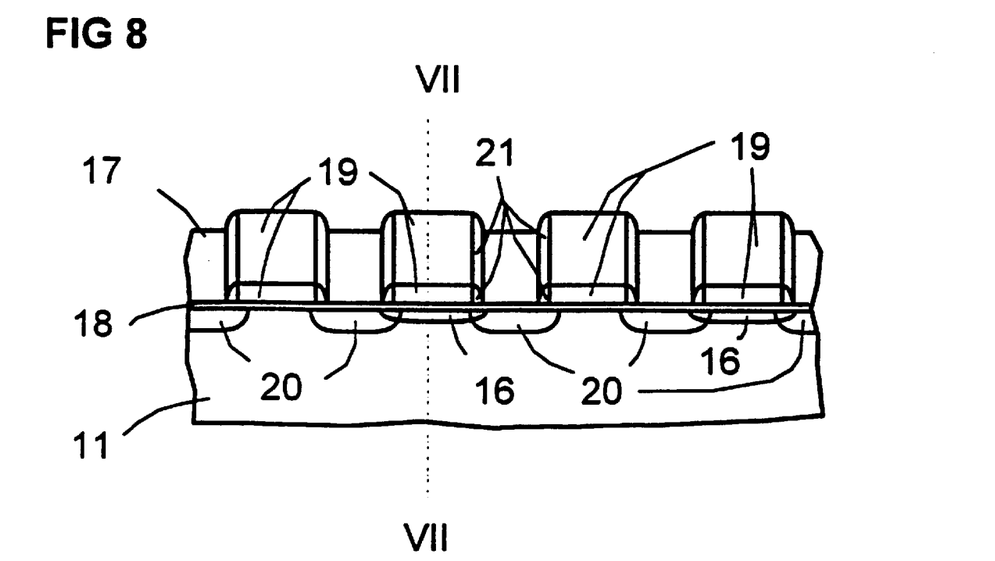
FIG. 8 shows that section through the silicon substrate which is designated by VIII—VIII in FIG. 7.
Figure 9:
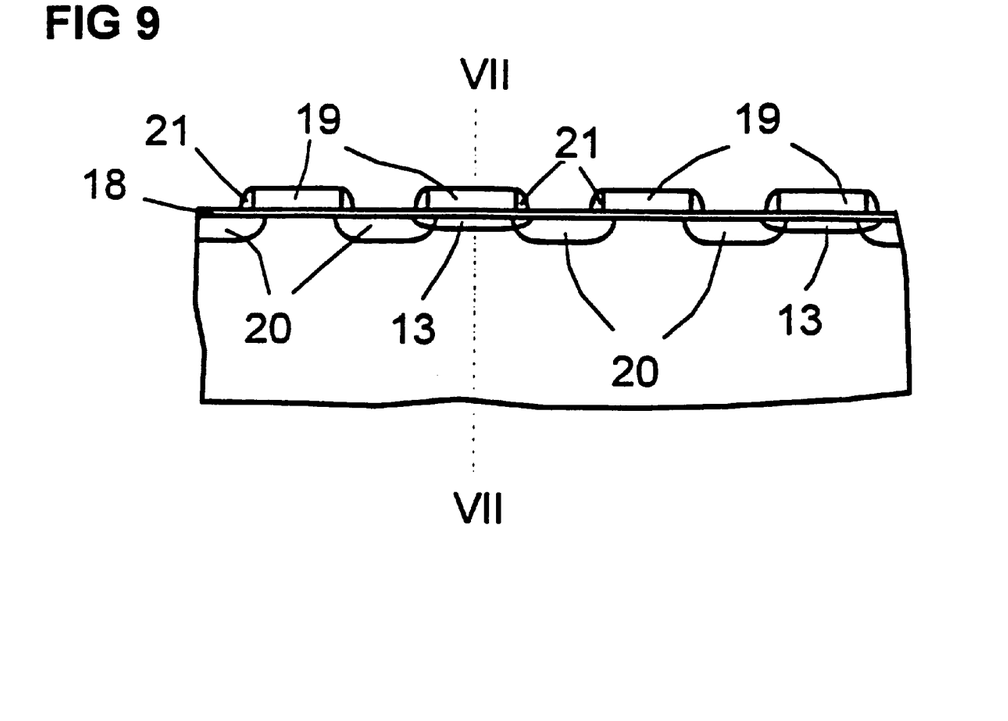
FIG. 9 shows that section through the silicon substrate which is designated by IX—IX in FIG. 7.
Figure 10:
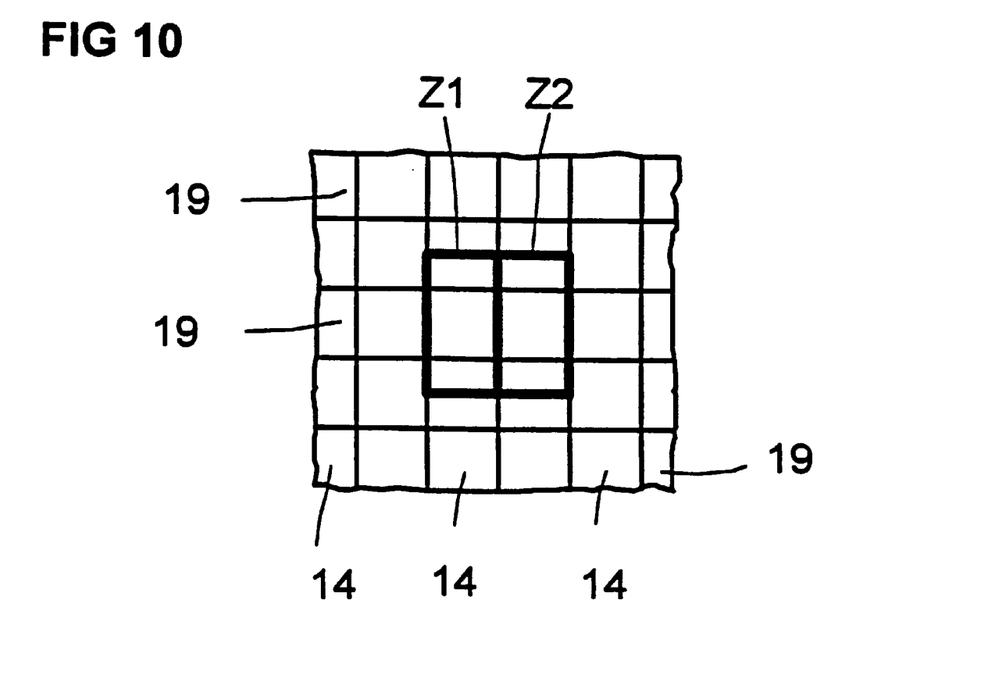
FIG. 10 shows a plan view of the silicon substrate illustrated in FIG. 7.

The section illustrated in FIG. 7 is designated by VII—VII both in FIG. 8 and in FIG. 9).

A polysilicon layer is deposited over the whole area to a thickness of, for example, 400 nm. By structuring the polysilicon layer in a photolithographic process step, word lines 19 are formed which run along the main area 12, for example perpendicular to the longitudinal trenches 14. The width of and spacing between the word lines 19 in each case correspond to a minimum structure size F of, for example, F=0.4 µm. The word lines 19 run in such a way that depletion channels 16 formed at the bottom of the longitudinal trenches 14 are respectively arranged underneath a word line 19.

A source/drain implantation is subsequently carried out with, for example, arsenic at an energy of, for example, 25 keV and a dose of, for example, $5 \times 10^{15}$ cm$^{-2}$. During the source/drain implantation, doped regions 20 are produced at the bottom of the longitudinal trenches 14 and in the main area 12 between the longitudinal trenches 14. The doped regions 20 each act as a common source/drain region for two adjacent MOS transistors arranged along a row. The word lines 19 are simultaneously doped during the source/drain implantation.

The sides of the word lines 19 are covered with spacers 21 by deposition and anisotropic etching back of a further SiO$_2$ layer. The source/drain implantation takes place in a self-aligned manner with regard to the word lines 19. Since the doped regions 20 are doped by the same conductivity type as the depletion channels 13, 16, the alignment during the definition of the depletion channels in the direction parallel to the course of the longitudinal trenches 14 is not critical. Corresponding to the distance between adjacent word lines 19, the distance between adjacent longitudinal trenches 14 and the dimensions of the longitudinal trenches 14, the area of the doped regions 20 parallel to the main area 12 is at most F×F, that is to say, for example, 0.4 µm×0.4 µm.

Each two adjacent doped regions 20 and the word line 19 arranged in between in each case form an MOS transistor. A row of MOS transistors, which are interconnected in series and are each formed from two doped regions 20 and the word line 19 arranged in between them, is arranged in each case on the bottom of the longitudinal trenches 14 and between the longitudinal trenches 14. The MOS transistors arranged on the bottom of a longitudinal trench 14 are insulated from the adjacent MOS transistors arranged between the longitudinal trenches 14 by the insulation structure, which is composed of the spacer 17 and the etching residue 15. This insulation structure has a maximum thickness of approximately 150 nm, with the result that the threshold voltage of the parasitic MOS transistor formed on the sides of the longitudinal trenches 14 is high enough to prevent a leakage current.

At the edge of the read-only memory cell arrangement, each row is provided with two connections, between which the MOS transistors arranged in the row are interconnected in series (not illustrated). The MOS transistors situated in the respective row can be driven in the sense of a "NAND" architecture via these connections.

If account is taken of the fact that each of the doped regions 20 is the source/drain region for two adjoining MOS transistors, then the length of each MOS transistor parallel to the course of the longitudinal trenches 14 is two F. The width of the MOS transistors is in each case F. The area for a memory cell formed from an MOS transistor is therefore 2 F$^2$, dictated by production. Memory cells which are adjacent along a word line 19 and whose contours Z1, Z2 are illustrated as an emboldened line in the plan view in FIG. 10 adjoin one another directly when projected onto the main area 2. The memory cell Z1 is arranged on the bottom of a longitudinal trench 14, whereas the memory cell Z2 is arranged on the main area 12 between two adjacent longitudinal trenches 14. By arranging adjacent memory cells in two vertically offset planes, the packing density is increased without the insulation between adjacent memory cells being impaired.

The read-only memory cell arrangement is programmed during the first channel implantation and the second channel implantation. The depletion channels 13, 16 are formed only for those MOS transistors to which a first logic value is assigned. A second logic value is assigned to the other MOS transistors.

The read-only memory cell arrangement is completed by depositing an intermediate oxide, contact hole etching and applying and structuring a metal layer. These known process steps are not depicted.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. An integrated circuit arrangement, comprising:
    a first electronic component and a second electronic component, each of which are integrated in a semiconductor substrate, the semiconductor substrate having a main area that is at least a portion of a surface of the substrate;
    at least one trench in the semiconductor substrate, the trench reaching from the main area of the semiconductor substrate down into the semiconductor substrate and the trench having an insulation structure which insulates the first electronic component from the second electronic component;
    at least one side of the trench having a bulge, so that a width of the trench is greater in a region of a trench bottom of the trench than in a region of the main area;
    the insulation structure adjoining the side and extending, in a direction perpendicular to the main area, from the main area down to the trench bottom, a thickness of the insulation structure being greater in a region of the bulge than in the region of the main area; and
    the first electronic component arranged on the main area and the second electronic component arranged on the trench bottom.

2. The integrated circuit arrangement according to claim 1, wherein the circuit arrangement has a plurality of identical strip-like trenches, which run substantially parallel, whose sides have bulges in the region of the trench bottom and whose sides are each provided with an insulation structure; and wherein the circuit arrangement has a plurality of MOS transistors of a memory cell arrangement which are interconnected in series, respective transistors arranged on the main area between adjacent trenches and on the trench bottoms.

3. A method for producing an integrated circuit arrangement having at least two mutually insulated electronic components, comprising the steps of:

producing at least one trench in a main area of a semiconductor substrate, the trench having a bulge in at least one side thereof in a region of a trench bottom of the trench, in which bulge a trench width is greater than a width of the main area, the main area being at least a portion of a surface of the substrate;

producing an insulation structure on a side with the bulge, which insulation structure extends from the main area down to the trench bottom and is thicker in a region of the bulge than in a region of the main area;

producing a first electronic component and a second electronic component in the semiconductor substrate such that the first and second electronic components are insulated from one another by the insulation structure; and producing the first component on the main area of the semiconductor substrate and the second component on the trench bottom.

4. The method according to claim 3, wherein the method further comprises an etching process with two etching steps that is carried out to produce the trench, anisotropic etching being carried out in a first etching step and isotropic etching being carried out in a second etching step.

5. The method according to claim 4, wherein an anisotropic plasma etching process is carried out in the first etching step and one of an isotropic plasma etching process or isotropic wet etching is carried out in the second etching step.

6. The method according to claim 3, wherein the trench is produced as a longitudinal trench, wherein the trench is filled with a first insulating layer to form the insulation structure, wherein the first insulating layer is etched back by anisotropic etching selectively with respect to the semiconductor substrate, an etching residue remaining which substantially fills the bulge, wherein an insulating spacer is produced at least on the side of the trench by deposition and anisotropic etching back of a second insulating layer having substantially conformal edge covering, which insulating spacer forms the insulation structure together with the etching residue.

7. The method according to claim 6, wherein a plurality of longitudinal trenches are produced, which run essentially parallel, whose sides have bulges in the region of the trench bottom and whose sides are each provided with an insulation structure, wherein a plurality of MOS transistors of a memory cell arrangement which are interconnected in series are respectively formed on the main area between adjacent longitudinal trenches and on the trench bottoms.

* * * * *